US011839044B2

United States Patent
Tang et al.

(10) Patent No.: US 11,839,044 B2
(45) Date of Patent: *Dec. 5, 2023

(54) POWER ELECTRONICS UNIT HAVING AN INTEGRATED CURRENT SENSOR FOR FORMING A MODULE; AND DRIVE TRAIN

(71) Applicant: Schaeffler Technologies AG & Co. KG, Herzogenaurach (DE)

(72) Inventors: Linbo Tang, Baden-Baden (DE); Marco Bender, Sasbachwalden (DE); Matthias Kästle, Lauf (DE); Jan-Ulrich Biskup, Sinzheim (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/173,860

(22) Filed: Feb. 24, 2023

(65) Prior Publication Data

US 2023/0199996 A1 Jun. 22, 2023

Related U.S. Application Data

(63) Continuation of application No. 17/050,486, filed as application No. PCT/DE2019/100053 on Jan. 21, 2019, now Pat. No. 11,617,280.

(30) Foreign Application Priority Data

Apr. 24, 2018 (DE) .................. 102018109803.0

(51) Int. Cl.
*H05K 7/14* (2006.01)
*H02M 1/00* (2006.01)
*H02M 7/00* (2006.01)

(52) U.S. Cl.
CPC ........ *H05K 7/1432* (2013.01); *H02M 1/0009* (2021.05); *H02M 7/003* (2013.01)

(58) Field of Classification Search
CPC .... H02M 7/003; H02M 1/0009; G01R 31/42; G01R 1/04; H05K 7/1432
See application file for complete search history.

(56) References Cited

U.S. PATENT DOCUMENTS 10,932,397 B2 * 2/2021 Yamahira .............. H02M 7/003
2006/0052914 A1 3/2006 Kubokawa et al.
(Continued)

FOREIGN PATENT DOCUMENTS

| CN | 102761287 | 10/2012 |
| GB | 2305028 | 3/1997 |
| KR | 20150141404 | 12/2015 |

OTHER PUBLICATIONS

Eichler, Bernhard, "Optimieren durch Integrieren—Integrierte Shunt-Wilderstande in Leistungsmodulen", pp. 70-71, https://www.semikron.com/dl/service-support/downloads/download/semikron-fachartikel-optimieren-durch-integriren-2016-10-14, Sep. 1, 2016.

(Continued)

*Primary Examiner* — Kyle J Moody
*Assistant Examiner* — Jye-June Lee
(74) *Attorney, Agent, or Firm* — Volpe Koenig

(57) ABSTRACT

A power electronics unit (1) for an electric drive unit, having an electrically conductive carrier element (2) and a power semiconductor module (3) arranged on the carrier element (2). The power semiconductor module (3) is designed to convert a direct current into a three-phase alternating current, and a current sensor (4) used to determine the alternating current is integrated such that it forms a main module (5) with the carrier element (2) and the power semiconductor module (3). A drive train for a motor vehicle having such a power electronics unit (1) is also provided.

16 Claims, 3 Drawing Sheets

(56) References Cited

U.S. PATENT DOCUMENTS

| | | | |
|---|---|---|---|
| 2011/0058391 A1* | 3/2011 | Ueno | H02M 7/003 363/13 |
| 2013/0265808 A1* | 10/2013 | Ishii | H02M 7/003 363/97 |
| 2014/0016823 A1 | 6/2014 | Uetake et al. | |
| 2016/0014916 A1 | 1/2016 | Ausserlechner et al. | |
| 2020/0233015 A1* | 7/2020 | Kikuchi | G01R 19/0092 |

OTHER PUBLICATIONS

Krupp, Johannes, "No Need for External Sensors in New Inverters", https://www.Isemikron.com/dl/service-support/downloads/download/semikron-article-no-need-for-external-sensors-en-2016-05-01, pp. 24-30, May 1, 2016.

* cited by examiner

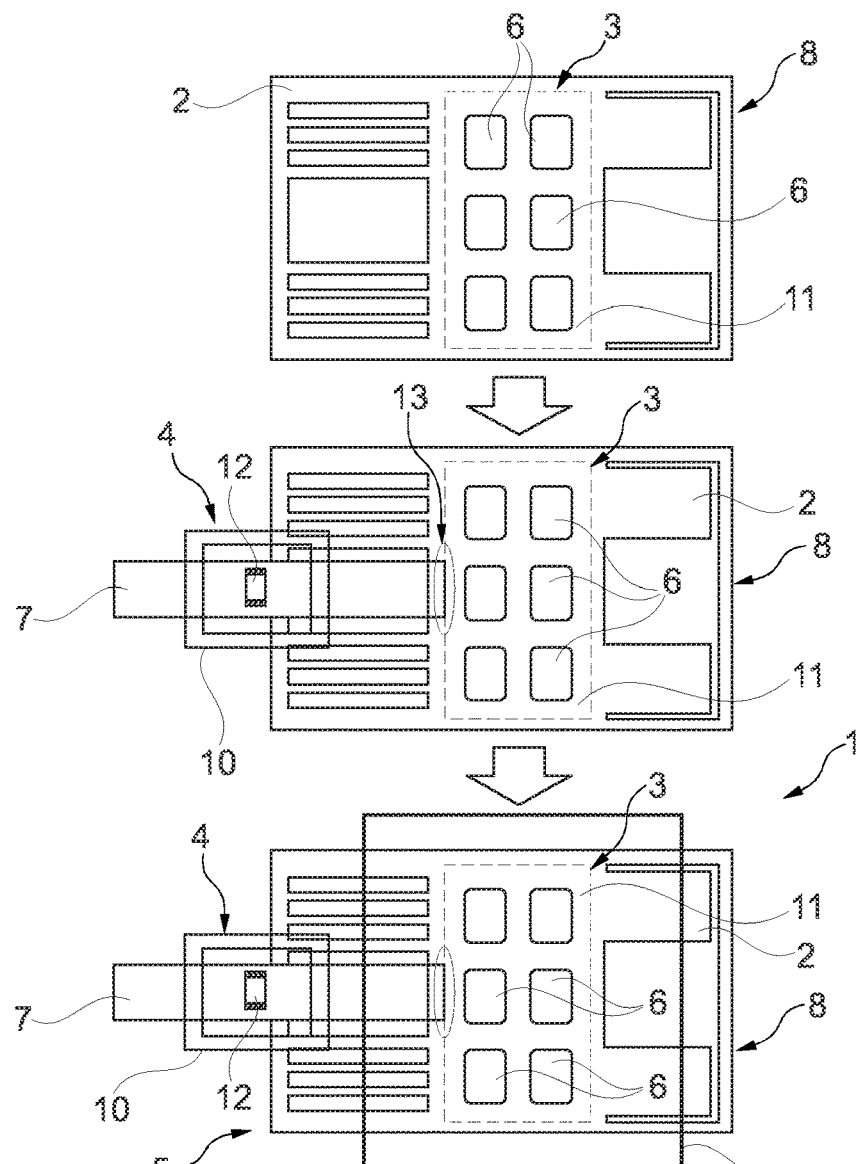
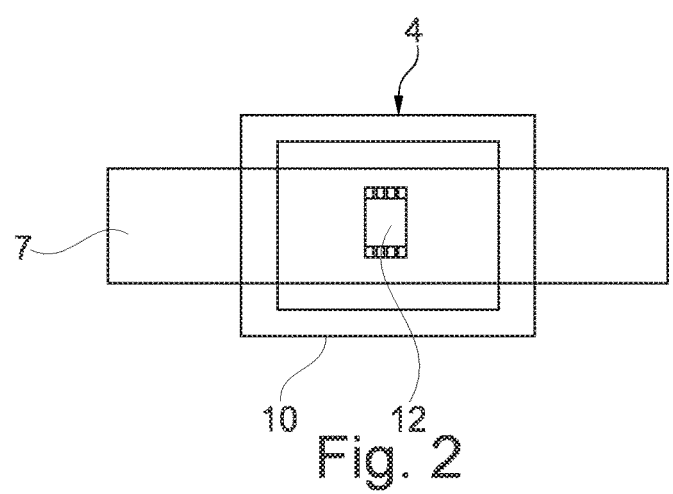

POWER ELECTRONICS UNIT HAVING AN INTEGRATED CURRENT SENSOR FOR FORMING A MODULE; AND DRIVE TRAIN

CROSS-REFERENCE TO RELATED APPLICATIONS

This application is a continuation of U.S. application Ser. No. 17/050,486, filed Oct. 26, 2020, which is a 371 National Phase of International Application PCT/DE2019/100052, filed Jan. 21, 2019, which claims priority to German Patent Application No. 10 2018 109 803.0, filed Apr. 24, 2018, the entire contents of which are incorporated herein by reference as if fully set forth.

TECHNICAL FIELD

A power electronics unit for an electric drive, e.g., a fully or partially electric drive train of a motor vehicle, having an electrically conductive carrier element and a power semiconductor module arranged on the carrier element, wherein the power semiconductor module is designed to convert a direct current into a three-phase alternating current. A drive train having an electric motor and the power electronics unit electrically connected to this electric motor is also provided.

BACKGROUND

Prior art of the generic type is known, for example, from KR 20150141404 A, by which basic power electronics are disclosed.

Thus, power electronics are already known that convert a direct current (DC) from a battery into a three-phase alternating current (AC) for an electric motor. Power semiconductor modules, for example, are used for this conversion.

However, in the embodiments known from the prior art, it has been found to be disadvantageous that the known power electronics units are often constructed in a relatively complex manner. In particular, if a current is also to be measured, the current sensors are usually connected as separate component units behind the power semiconductor module. As a result, a relatively large amount of installation space is required and the manufacturing effort is relatively high.

SUMMARY

Therefore, the object of the present disclosure is to eliminate the disadvantages known from the prior art and, in particular, to provide a power electronics unit which, on the one hand, allows reliable current measurement and, on the other hand, is designed in as compact a manner as possible.

This is achieved according to an embodiment in that a current sensor used to determine the alternating current (in its magnitude) is integrated in such a way that it forms a (common) main module with the carrier element and the power semiconductor module.

Thus, the power semiconductor module is in turn assembled in a modular manner together with the current sensor. This enables a particularly compact design of the combination of the power semiconductor module and the current sensor. On the one hand, the structure is as compact as possible and, on the other hand, it can be manufactured as simply as possible.

Further advantageous embodiments are explained in more detail below.

Accordingly, it is also advantageous if the current sensor is electrically connected to a power semiconductor of the power semiconductor module. This makes the construction even more compact.

If the current sensor is mechanically connected directly to the carrier element, the structure can be further simplified.

In this connection, it is also useful if the current sensor is applied directly to the carrier element. This results in an integration of the current sensor at the chip level. This further reduces the manufacturing effort.

Alternatively to attaching the current sensor directly to the carrier element, it is also advantageous if the current sensor is indirectly mechanically connected to the power semiconductor module and/or the carrier element. This further simplifies the manufacturing effort.

In connection with this, it is also useful if the current sensor is attached to a conductor rail and the conductor rail is further electrically and/or mechanically connected to the carrier element and/or the power semiconductor of the power semiconductor module.

If the current sensor is arranged outside or inside a substantially rectangular outer contour of the carrier element or partially overlapping with this outer contour, a suitable compromise between a compact design and easy production is implemented.

The power semiconductor module is furthermore preferably enclosed by a module housing so that the efficiency and the service life of the power electronics unit are significantly extended.

In connection with this, it is again useful if the current sensor is also arranged/integrated into the module housing. A particularly compact construction is thus achieved. Alternatively, it is also advantageous to arrange the current sensor in a sensor housing designed separately from the module housing (preferably outside of the module housing). This simplifies the assembly.

The power semiconductor module is preferably implemented as an IGBT module, i.e., a modular bipolar transistor with an insulated gate electrode. This makes the construction particularly efficient.

If the carrier element is implemented as a lead frame, the manufacturing effort is again significantly reduced.

A drive train (preferably a purely electromotive/electric drive train, more preferably a hybrid drive train) for a motor vehicle is also provided, having a power electronics unit electrically connected to an electric motor according to at least one of the embodiments described above. The power electronics unit is also preferably electrically connected to a battery. The power electronics unit is thus designed in principle for the field of application of the motor vehicle, but in further embodiments it can also generally be designed for other applications in which the power electronics unit designed as a corresponding AC converter can be used.

In other words, a current sensor is thus integrated into a power module (power electronics unit). The current sensor is attached/integrated into the power semiconductor module by connection technology or is arranged on a chip level by integration.

BRIEF DESCRIPTION OF THE DRAWINGS

The embodiments will now be explained in more detail below with reference to the figures in connection with various exemplary embodiments.

In the figures:

FIG. 1 shows a plan view of a power electronics unit according to a first exemplary embodiment in various states of assembly, wherein only one power semiconductor module is applied to a carrier element in the uppermost partial illustration of FIG. 1, additionally a current sensor is connected to the power semiconductor module via a conductor rail in the central partial illustration of FIG. 1, and a module housing additionally encloses the power semiconductor module in the lower partial illustration of FIG. 1, FIG. 2 shows a plan view of the assembly of a current sensor and a conductor rail used in FIG. 1.

DETAILED DESCRIPTION

Figure 3:
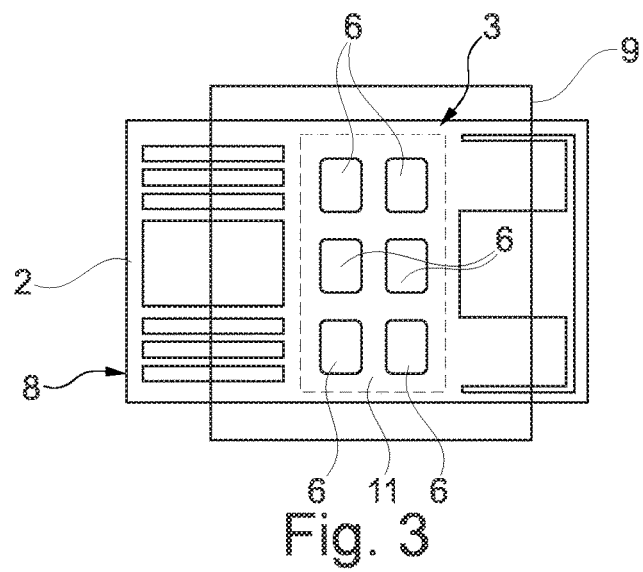
FIG. 3 shows a plan view of an assembly from the carrier element, the power semiconductor module and the module housing, as they are used in FIG. 1.

The figures are only schematic in nature and serve only for understanding the embodiments. The same elements are provided with the same reference symbols. The different features of the various exemplary embodiments can also be freely combined with one another.

A power electronics unit 1 is illustrated according to a first exemplary embodiment in FIG. 1. The power electronics unit 1 is illustrated in FIG. 1 in different states of assembly, wherein the lower partial illustration shows the essentially complete power electronics unit 1. The power electronics unit 1, designed as an alternating current converter, is used during operation in a typical manner to convert a direct current predetermined by a battery on the input side into an alternating current used on the output side to drive an electric motor of a motor vehicle drive train.

The power electronics unit 1 has an electrically conductive carrier element 2, which in this embodiment is implemented in the form of a lead frame. The carrier element 2 also accommodates a power semiconductor module 3. The power semiconductor module 3 typically has multiple power semiconductors 6 which are embedded on a substrate 11, here a ceramic substrate. The power semiconductor module 3 is mechanically fastened to the carrier element 2 and, with its power semiconductors 6, is electrically connected to a current input and a current output via various conductor tracks, not shown here for the sake of clarity. The power semiconductor module 3 is implemented as an IGBT module. The pre-assembly of the carrier element 2 with the power semiconductor module 3 can be seen clearly in the upper partial illustration of FIG. 1.

The power electronics unit 1 has a current sensor 4, as shown in the central partial illustration of FIG. 1. The current sensor 4 is integrated directly into the power electronics unit 1. In particular, the current sensor 4 forms a common main module 5/electronics module with the carrier element 2 and the power semiconductor module 3. The current sensor 4, the carrier element 2 and the power semiconductor module 3 are thus integrated into a modular system.

In this embodiment, the current sensor 4 is mechanically attached indirectly to the carrier element 2 and to the power semiconductor module 3. For this purpose, the current sensor 4 is, as can be clearly seen in FIG. 2, fastened to a conductor rail 7. For this purpose, an area of the current sensor 4 having a chip 12 is electrically and mechanically attached/fastened directly to the conductor rail 7. A sensor housing 10 surrounds the current sensor 4 from the outside, so that the current sensor 4 is closed off from the surroundings by the sensor housing 10. As also indicated in the central partial illustration of FIG. 1, the conductor rail 7 is electrically connected directly to the power semiconductor module 3, namely a power semiconductor 6. A common type of connection, such as welding, soldering or other a similar type of connection, is typically used for this purpose. The conductor rail 7 is also preferably fastened to the carrier element 2.

In the finished state of assembly of the power electronics unit 1, which is illustrated in the lower partial illustration of FIG. 1, the power semiconductor module 3 is additionally enclosed by a module housing 9. This module housing 9 is arranged spaced apart from the sensor housing 10, i.e., the sensor housing 10 is arranged outside of the module housing 9. The module housing 9 completely accommodates the power semiconductors 6 of the power semiconductor module 3. In particular, a (mechanical and electrical) connection point 13 between the conductor rail 7 and the power semiconductor 6/the power semiconductor module 3 is also enclosed by module housing 9. The module housing 9 is shown together with the power semiconductor module 3 and the carrier element 2 without a current sensor 4 in FIG. 3.

With regard to the shape of the carrier element 2, it can also be seen in FIG. 1 that this is essentially rectangular when viewed from above, i.e., when viewed in one plane. The carrier element 2 thus has a rectangular outer contour 8. In this embodiment, the current sensor 4 is arranged partially overlapping with respect to this outer contour 8. In particular, the conductor rail 7 protrudes from an outside to an inside of the outer contour 8 to the power semiconductor module 3 over the outer contour 8.

According to the assembly process illustrated with the partial illustrations of FIG. 1, in a first step, the power semiconductor module 3 is first fastened to the carrier element 2 (upper partial illustration of FIG. 1). In a further step, the conductor rail 7 together with the current sensor 4 is fastened to the carrier element 2 and electrically and mechanically connected to the power semiconductor module 3 (central partial illustration of FIG. 1). According to the lower partial illustration of FIG. 1, the module housing 9 is finally attached in a further step.

In connection with FIGS. 4 and 5, further exemplary embodiments of the power electronics unit 1 are illustrated, for which purpose only the differences from the first exemplary embodiment are described below for the sake of brevity. The power electronics units 1 of FIGS. 4 and 5 correspond in principle to the power electronics unit 1 of the first exemplary embodiment in terms of function and construction.

Figure 4:
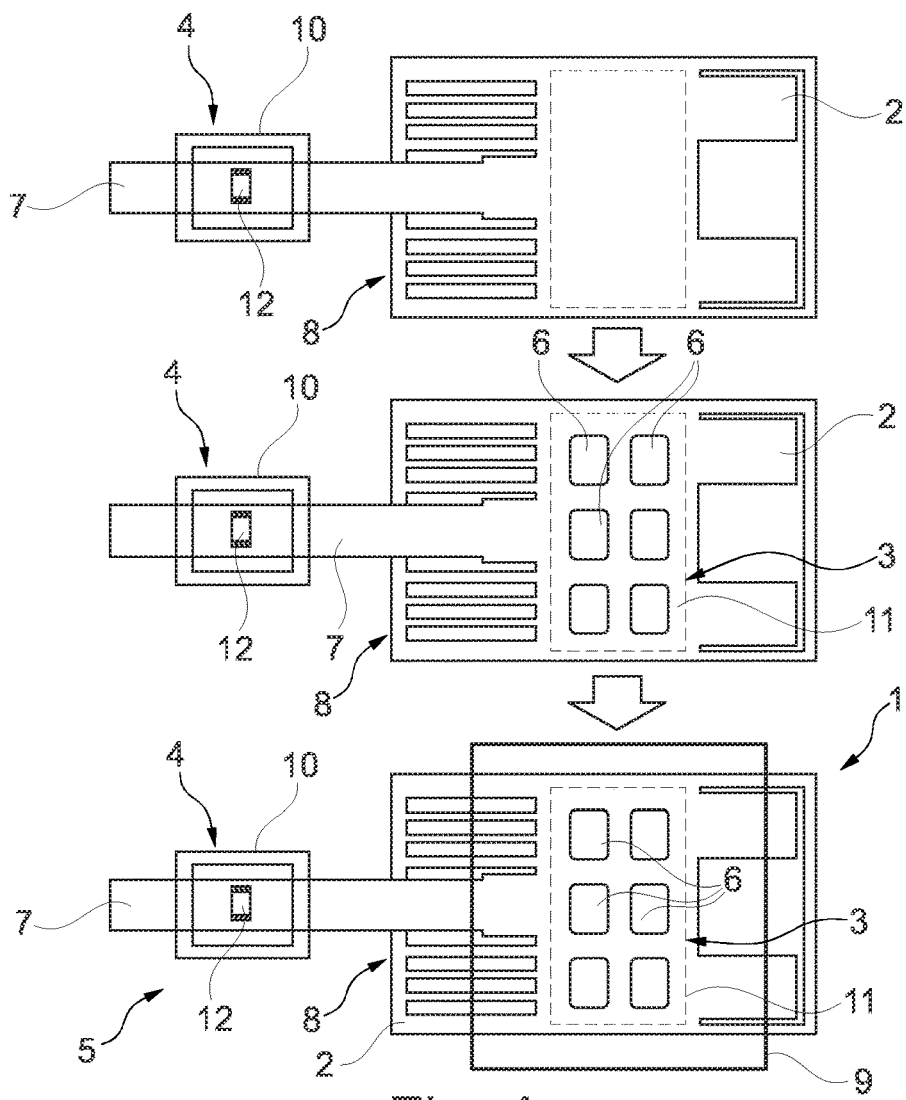
FIG. 4 shows a plan view of a power electronics unit according to a second exemplary embodiment in various states of assembly, wherein only the current sensor is connected to the carrier element via the conductor rail in the upper partial illustration of FIG. 4, additionally the power semiconductor module is attached to the carrier element in the central partial illustration of FIG. 4, and the module housing is also present in the lower partial illustration of FIG. 4.

The second exemplary embodiment is shown in connection with FIG. 4. Here, the length of the conductor rail 7 is selected and the current sensor 4 is arranged on the conductor rail 7 in such a way that the current sensor 4 with its sensor housing 10 is arranged outside of the outer contour 8 with respect to the power semiconductor module 3.

According to the assembly process illustrated with the partial illustrations of FIG. 4, the conductor rail 7 together with the current sensor 4 is already fastened to the carrier element 2 before the power semiconductor module 3 is attached to the carrier element 2 (upper partial illustration of FIG. 4). After the conductor rail 7 is mechanically and electrically attached to the carrier element 2, the power semiconductor module 3, as in FIG. 1, is fastened to the carrier element 2 and connected to the conductor rail 7 (central partial illustration of FIG. 4). In the lower partial illustration of FIG. 4, the module housing 9 is again attached according to the first exemplary embodiment.

In this connection, it should be pointed out that, in a further embodiment, the conductor rail 7 and the carrier element 2 directly form a single component which is specially adapted to the power semiconductor module 3. The process step of mechanically attaching the conductor rail 7 to the carrier element 2 is thus eliminated.

Figure 5:
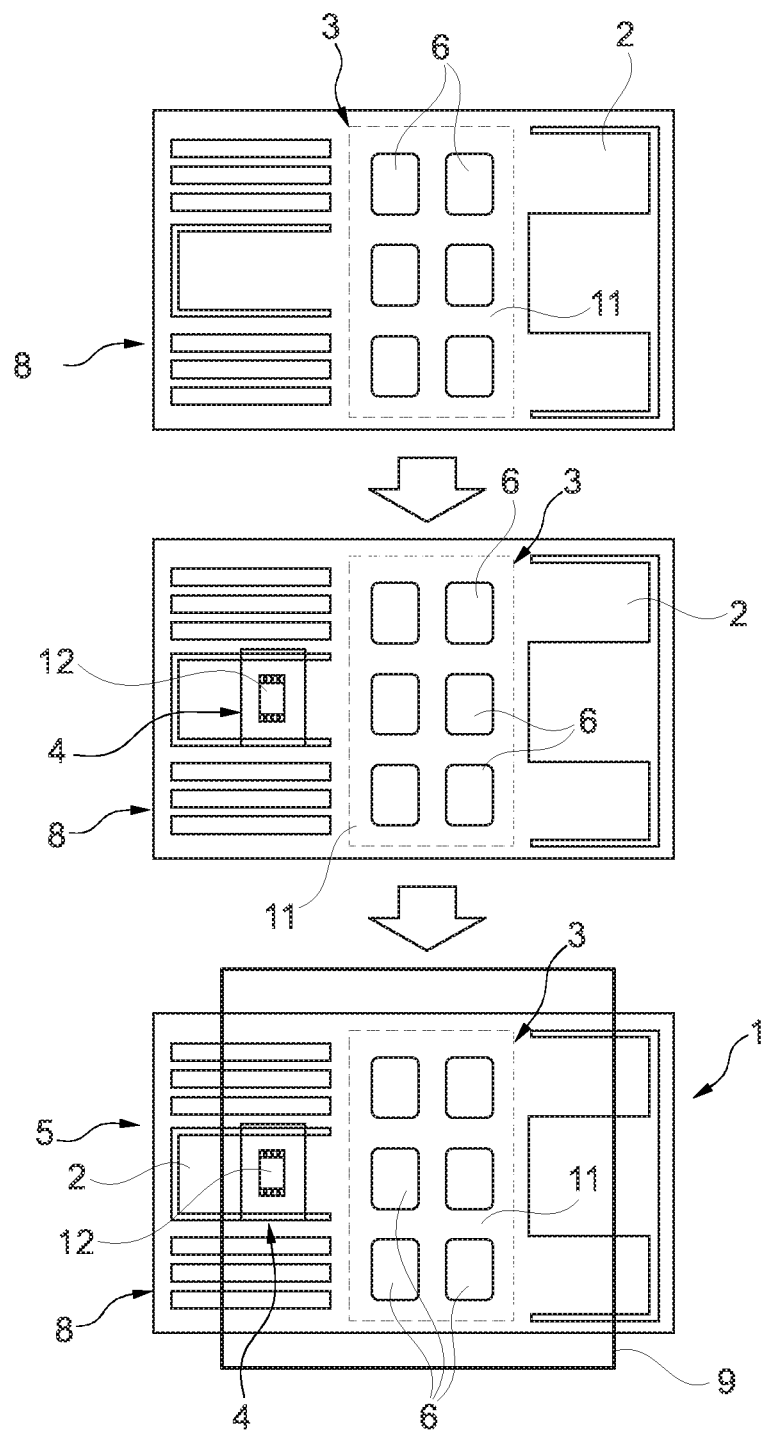
FIG. 5 shows a plan view of a power electronics unit according to a third exemplary embodiment in various states of assembly, wherein the power electronics module is only present on the carrier element in the upper partial illustration of FIG. 5, the current sensor is still directly applied to the carrier element in the central partial illustration of FIG. 5, and the module housing is attached both around the power semiconductor module and around the current sensor in the lower partial illustration of FIG. 4.

Finally, FIG. 5 illustrates the third exemplary embodiment, which shows that the current sensor 4 is in principle attached directly to the carrier element 2. In this embodiment, the current sensor 4 with its chip 12 is applied directly to the carrier element 2. The current sensor 4 is thus directly mechanically and electrically connected to the carrier element 2 and indirectly electrically connected to the power semiconductor 6 of the power semiconductor module 3. In this embodiment, a sensor housing 10 is eliminated, since the current sensor 4 is integrated together with the power semiconductor module 3 into the module housing 9. The current sensor 4 and the power semiconductor module 3 are thus enclosed by a common module housing 9 (lower partial illustration of FIG. 5). The current sensor 4 is arranged inside the outer contour 8.

According to the assembly process illustrated with the partial illustrations of FIG. 5, in a first step, the power semiconductor module 3 is first fastened to the carrier element 2 (upper partial illustration of FIG. 5). In a further step, the current sensor 4 is fastened directly to the carrier element 2 and electrically connected to the power semiconductor module 3 (central partial illustration of FIG. 5). According to the lower partial illustration of FIG. 5, the module housing 9 is finally attached in a further step.

In other words, the current sensor 4 is applied to a unit 5 by means of connection technology or integration at the chip level with the power semiconductor module 3. In principle, the following three variants I, II, II can be implemented.

Variant I (FIG. 1): Connection between the lead frame (carrier element 2) and the conductor rail 7 of the current sensor 4 inside the power semiconductor module (power semiconductor unit 1). The power semiconductor (power semiconductor module 3) including the lead frame 2 is manufactured as a unit. The current sensor 4, including the conductor rail 7, is led to the power semiconductor 3 and is directly electrically and mechanically connected to the power semiconductor 3, for example by means of welding or soldering processes. A housing (module housing 9) is finally applied around the power semiconductor 3 and areas of the lead frame 2 in order to protect the power semiconductors 6.

Variant II (FIG. 4): The current sensor 4 including the conductor rail 7 and the lead frame 2. The current sensor 4 is installed on a lead frame 2 with an extended conductor rail 7. The power semiconductor 3 is connected to the lead frame 2, for example, by means of soldering processes, welding or similar connection techniques. A housing 9 is then applied around the power semiconductor 3 and areas of the lead frame 2 in order to protect the power semiconductors 6.

Variant III (FIG. 5): The integrated current sensor 4 in the power semiconductor module (power semiconductor unit 1). The power semiconductors 6 including the lead frame 2 are produced as a unit. The current sensor 4 is to be applied to the conductor rail 7 of the lead frame 2 without a housing (sensor housing 10). A housing 9 is applied around the power semiconductor 3, areas of the lead frame 2 and the current sensor 4.

LIST OF REFERENCE SYMBOLS

1 Power electronics unit
2 Carrier element
3 Power semiconductor module
4 Current sensor
5 Main module
6 Power semiconductor
7 Conductor rail
8 Outer contour
9 Module housing
10 Sensor housing
11 Substrate
12 Chip
13 Connection point

The invention claimed is:

1. A power electronics unit for an electric drive unit, the power electronics unit comprising: an electrically conductive carrier element; a power semiconductor module arranged on and directly fastened to the carrier element, the power semiconductor module is configured to convert a direct current into a three-phase alternating current; a conductor rail integrated with and directly connected to the carrier element and the power semiconductor module; and a current sensor configured to measure the alternating current and fastened directly to the conductor rail, wherein the carrier element is a lead frame.

2. The power electronics unit according to claim 1, wherein the conductor rail is arranged to partially overlap a substantially rectangular outer contour of the carrier element.

3. The power electronics unit according to claim 1, wherein the current sensor is arranged outside a substantially rectangular outer contour of the carrier element.

4. The power electronics unit according to claim 1, wherein the current sensor is arranged partially overlapping with a substantially rectangular outer contour of the carrier element.

5. The power electronics unit according to claim 1, wherein the power semiconductor module is enclosed by a module housing.

6. The power electronics unit according to claim 5, wherein the current sensor is arranged in the module housing.

7. The power electronics unit according to claim 5, wherein the current sensor is arranged in a sensor housing formed separately from the module housing.

8. A drive train for a motor vehicle, comprising the power electronics unit according to claim 1 electrically connected to an electric motor.

9. A power electronics unit for an electric drive of a motor vehicle, the power electronics unit comprising: a main module including: an electrically conductive carrier element; a power semiconductor module arranged on and directly fastened to the carrier element, the power semiconductor module is configured to convert a direct current into a three-phase alternating current; a conductor rail integrated with and directly connected to the carrier element and the power semiconductor module; and a current sensor configured to measure the alternating current and fastened directly to the conductor rail, wherein the carrier element is a lead frame; and wherein the main module is preassembled as a single unit.

10. The power electronics unit of claim 9, wherein the conductor rail is arranged to partially overlap a substantially rectangular outer contour of the carrier element.

11. The power electronics unit of claim 9, wherein the current sensor is arranged outside a substantially rectangular outer contour of the carrier element.

12. The power electronics unit of claim 9, wherein the current sensor is arranged partially overlapping with a substantially rectangular outer contour of the carrier element.

13. The power electronics unit of claim 9, wherein the power semiconductor module is enclosed by a module housing.

14. The power electronics unit of claim 13, wherein the current sensor is arranged in the module housing.

15. The power electronics unit of claim 13, wherein the current sensor is arranged in a sensor housing formed separately from the module housing.

16. A drive train for a motor vehicle, comprising the power electronics unit according to claim 9 electrically connected to an electric motor.

* * * * *